United States Patent
Kawano et al.

(10) Patent No.: US 6,828,573 B1
(45) Date of Patent: Dec. 7, 2004

(54) ELECTRON BEAM LITHOGRAPHY SYSTEM

(75) Inventors: Hajime Kawano, Hitachinaka (JP); Minoru Wakita, Hitachinaka (JP); Masato Kamada, Hitachinaka (JP); Haruo Yoda, Nishitama-gun (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 09/315,988

(22) Filed: May 21, 1999

(30) Foreign Application Priority Data

May 29, 1998 (JP) .......................................... 10-149045

(51) Int. Cl.$^7$ .............................. G21G 5/00; A61N 5/00; G21K 5/10
(52) U.S. Cl. ............................... 250/492.23; 250/492.3; 250/492.22
(58) Field of Search ........................ 250/492.22, 492.23, 250/492.3, 492.21, 311, 310

(56) References Cited

U.S. PATENT DOCUMENTS

| | | | |
|---|---|---|---|
| 3,921,135 A | * 11/1975 | Komaru et al. | 345/530 |
| 4,463,265 A | 7/1984 | Owen et al. | 250/492.2 |
| 4,692,579 A | * 9/1987 | Saitou et al. | 250/398 |
| 5,051,598 A | 9/1991 | Ashton et al. | 250/492.2 |
| 5,149,975 A | 9/1992 | Yoda et al. | 250/492.2 |
| 5,278,421 A | 1/1994 | Yoda et al. | 250/492.2 |
| 5,754,443 A | 5/1998 | Manabe | 364/491 |
| 5,760,410 A | 6/1998 | Matsuki et al. | 250/492.2 |
| 5,792,581 A | 8/1998 | Ohnuma | |
| 5,885,748 A | 3/1999 | Ohnuma | |
| 5,933,212 A | 8/1999 | Kasuga | |
| 6,087,052 A | 7/2000 | Manabe et al. | |
| 6,350,992 B1 | 2/2002 | Manabe et al. | |

FOREIGN PATENT DOCUMENTS

| | | |
|---|---|---|
| JP | 52-119078 | 10/1977 |
| JP | 60198432 | * 10/1985 |
| JP | 62-046059 | 9/1987 |
| JP | 63-001032 | 1/1988 |
| JP | 63-014866 | 4/1988 |
| JP | 3-225816 | 10/1991 |
| JP | 4-258111 | 9/1992 |
| JP | 5-160010 | 6/1993 |
| JP | 05-226235 | 9/1993 |
| JP | 06-333796 | 12/1994 |
| JP | 7-201720-a | * 8/1995 |
| JP | 08-037146 | 2/1996 |
| JP | 8-213315 | 8/1996 |
| JP | 08-227842 | 9/1996 |
| JP | 09-045600 | 2/1997 |
| JP | 09-186058 | 7/1997 |
| JP | 9-293670 | 11/1997 |
| JP | 10-229047 | 8/1998 |
| JP | 11-111584 | 4/1999 |

OTHER PUBLICATIONS

Murai et al.: *Fast proximity effect correction method using a pattern area density map*, J. Vac.Sci. Technol. B 10 (6), Nov./Dec. 1992; pp. 3072–3076.

* cited by examiner

*Primary Examiner*—John R. Lee
*Assistant Examiner*—Kalimah Fernandez
(74) *Attorney, Agent, or Firm*—Kenyon & Kenyon

(57) ABSTRACT

An object of this invention is to provide an electron beam lithography system capable of rapidly creating an accurate exposure map for proximity effect correction. The inventive system creates the map by dividing shot figures by mesh and adding up the divided area values for each mesh. The system comprises: (1) a function for judging and dividing boundaries of shots to be rendered based on mesh positions as well as shot positions and figures in the map, and (2) a function for calculating divided shot area values and adding the values simultaneously to adjacent addresses in cumulative fashion in a plurality of memories furnished downstream of the system.

10 Claims, 14 Drawing Sheets

FIG.19
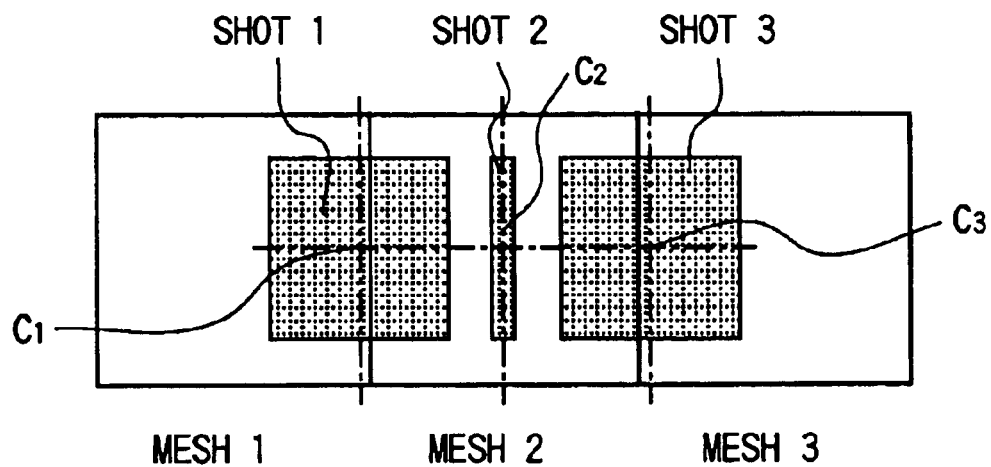
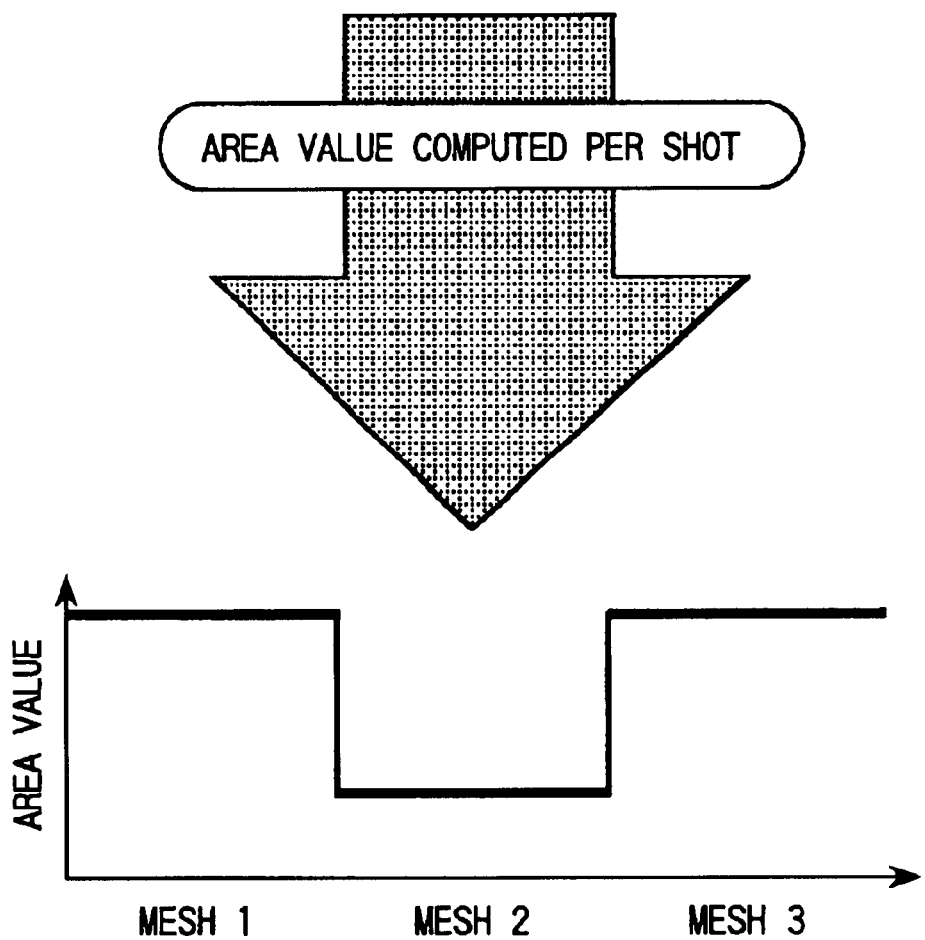

ELECTRON BEAM LITHOGRAPHY SYSTEM

BACKGROUND OF THE INVENTION

The present invention relates to an electron beam lithography system for rendering fine patterns using an electron beam.

Generally, electron beam lithography systems are known for such characteristics as (1) an ability to form fine patterns, (2) possession of a pattern generating function, and (3) a capability of correcting distortion. With these features in their arsenal, the systems have been used extensively in developing LSIs and fabricating masks for optical exposure. While excelling in fine working, the electron beam lithography systems are nevertheless confronted with a physically unavoidable bottleneck known as the proximity effect experienced when VLSI patterns are rendered on the submicron order.

FIG. 16 is a schematic view illustrating the principle of the proximity effect. In FIG. 16, an electron beam 72 is incident on a substrate 70 over which an electron beam resist 71 has been applied. The proximity effect is caused primarily by two kinds of electron scattering: forward scattering and backward scattering. Electrons emitted by an electron gun and incident on the electron beam resist 71 first collide with component atoms of the resist 71 and are scattered thereby continuously while discharging their energy. The process is called forward scattering. Most of the incident electrons penetrate the substrate, get scattered thereby and return partially to the resist 71. This process is called backward scattering.

These processes result in the incident energy being accumulated not only in the irradiated (i.e., exposed) region but also elsewhere. Hence an insufficient dose (exposure) likely to occur in rendering fine patterns. Conversely, excess energy tends to accumulate in space between figures of a large pattern. Consider a case where an electron beam is used to render a pattern made of a plurality of figures. In that case, if the figures are numerous and are clustered in close proximity, they tend to be rendered thick; if the figures are sparsely distributed and isolated from one another, they are likely to be rendered thin. The phenomenon is called the proximity effect.

One technique for correcting the proximity effect is disclosed illustratively in Japanese Published Unexamined Patent Application No. Hei 03-225816. The disclosed technique involves calculating a rendering area of each of regions divided by rendering data and thereby creating a dose (exposure) map. The exposure map is referenced for each shot. The exposure is increased for patterns of low rendering densities and lowered for patterns of high rendering densities, whereby each pattern is rendered at an optimum exposure level in keeping with the rendering density in effect.

Other techniques have been proposed to correct the proximity effect. For example, U.S. Pat. No. 4,463,265 discloses a so-called ghost method whereby a defocused electron beam is used to render a monochromatically reversed pattern of a target figure for correcting the proximity effect. Japanese Published Examined Patent Application No. Sho 63-14866 describes a method for obtaining levels of exposure at opposing ends of a dimensionally corrected pattern so that the pattern ends will have intensity ratios lower than a predetermined value. Japanese Published Examined Patent Application No. Sho 62-46059 discloses a method for acquiring a ratio of an irradiation density at which a resist pattern of the same size as that of a target rendering pattern is obtained, to an irradiation density at which a predetermined residual film is provided, so that the target pattern is rendered at a suitable irradiation density and in a suitable size for the residual film to be formed.

The technique disclosed in Japanese Published Unexamined Patent Application No. Hei 03-225816 is characterized in that it initially carries out mock rendering to create an exposure map and then performs actual rendering by referring to the exposure map thus created.

FIG. 17 is a schematic block diagram illustrating the concept of the above technique. Rendering data that are input to an input unit 81 comprise exposure data as well as position and shape data about each of shots computed by a figure disassembling and reassembling correction unit located upstream of the input unit 81. The exposure map is created by first carrying out mock rendering. When rendering data (shot shapes and positions) are received from the preceding stage, an area value computing unit 82 calculates the area of each shot.

As shown in FIG. 18, the rendering data are divided into square meshes having a side length of $\alpha$ each. To a mesh containing a center 91 of each shot 90, the area of the shot in question is added cumulatively. The result is stored temporarily in a memory portion called a partial memory 83. The process is repeated. The area value held in the partial memory 83 is transferred to an exposure map memory 84. The data retained in the exposure map memory 84 are subjected to such processes as data smoothing by a smoothing filter 85. The processed data are placed back into the exposure map memory 84.

Actual rendering is then performed as follows: the same rendering data are again received from the preceding stage. Given the shot position and shape data, an address computing unit 86 calculates an address in the exposure map. The area value for the calculated address in the exposure map memory 84 is converted simultaneously to a level of exposure by an exposure converting unit 87. An adder 88 adds or subtracts the exposure level to or from the exposure of each shot. The output of the adder 88 is forward downstream through an output unit 89. In this manner, shots included in large-area meshes are assigned low levels of exposure while those in small-area meshes are given high levels of exposure, whereby desired correction is supposed to be accomplished.

Where the exposure map is created by adding the area of each shot to a mesh containing the center of the shot in question, as described above, problems occur if the shot center is located close to a mesh boundary. FIG. 19 is a schematic view outlining such problems experienced illustratively when three meshes contain a number of shots.

In FIG. 19, shots 1 and 3 are significantly close in size to their corresponding meshes while a shot 2 is appreciably smaller than its corresponding mesh. The shot 1 straddles the meshes 1 and 2. The center C1 of the shot 1 is included in the mesh 1 close to the boundary between the meshes 1 and 2. The shot 2 together with its center C2 is included in the mesh 2. The shot 3 straddles the meshes 2 and 3. The center C3 of the shot 3 is included in the mesh 3 close to the boundary between the meshes 2 and 3.

In the above makeup, the proximity effect works in such a manner that space between shots tends to be narrowed. Thus to correct the adverse effect requires reducing the exposure of the shot 2. With the above conventional method, however, the area value is accumulated at the center of each shot so that, as shown in the lower part of FIG. 19, all area value of the shot 1 is added to the mesh 1 and the entire area value of the shot 3 is added to the mesh 3.

Meanwhile, the mesh 2 that needs to have the largest possible area value is only supplemented by the area value of the shot 2. As a result, the meshes 1 and 3 are given large area values while the mesh 2 is assigned a small area value. When this kind of exposure map is used for exposure correction, the shot 2 in the mesh 2 is corrected to have a raised level of exposure and the shots 1 and 3 are corrected to have lowered levels of exposure. This type of exposure correction is contrary to what is expected of the corrective process implemented. Exposure correction remains unavailable.

FIGS. 20 and 21 illustrate specific simulations for purpose of illustration. FIG. 20 shows rendering data representing a 60 $\mu$m×60 $\mu$m square. FIG. 21 depicts a three-dimensional exposure map created by dividing the rendering data into 3.0 $\mu$m×3.0 $\mu$m shots. In this exposure map, each mesh measures 5.12 $\mu$m by 5.12 $\mu$m within a range of 20 by 20 meshes. The obtained values are each given as a percentage of the shot area in each mesh, i.e., as area ratios.

Seen in FIG. 20, the exposure map may be expected to have a substantially uniform area ratio distribution in the figure-containing region. In fact, simulation results in a distinctly undulating exposure map as shown in FIG. 21. If rendering were performed by use of this map, exposure errors of up to ±40% would occur. Such extensive exposure errors would completely nullify any expectations of enhanced accuracy, and the attempt to correct the proximity effect would come to nothing.

At present, the accuracy of proximity error correction is typically raised by reducing the shot size. Illustratively, dividing rendering data into 0.64 $\mu$m×0.64 $\mu$m shots allows an exposure map to be created to ±5% precision. When the undulating map thus created is subjected to smoothing (e.g., by use of an averaging filter in specific mesh regions), the error may be further reduced to ±1.5% or less.

The above technique has its share of disadvantages. Reducing the shot size increases the number of shots in the same figure rendered. Illustratively, if the shot size is reduced from 3.0 $\mu$m×3.0 $\mu$m to 0.64 $\mu$m×0.64 $\mu$m, the number of shots is increased by a factor of about 22[=(3.0/0.64)2]. Because the time required to create an exposure map is substantially proportional to the number of shots involved, the processing time would theoretically by 22 times as long as the original duration. Although the degree of increases in processing time may not be so dramatic with actual rendering data, this is an illustration of how much time is needed to enhance mapping precision.

SUMMARY OF THE INVENTION

It is therefore an object of the present invention to overcome the above and other deficiencies and disadvantages of the prior art and to provide an electron beam lithography system capable of creating a highly precise exposure map without reducing shot sizes.

The foregoing and other objects of this invention are achieved illustratively by an electron beam lithography system which divides shots by mesh boundaries and splits an area in a given mesh for cumulative addition of the split area value to an adjacent mesh. The center of each shot is not considered when an exposure map is created.

FIG. 1 is a conceptual view showing the principle of this invention schematically. In FIG. 1, a shot 1 straddles meshes 1 and 2, a shot 2 is inside the mesh 2, and a shot 3 straddles the mesh 2 and a mesh 3. In such a case, the area value of the shot 1 is divided into the meshes 1 and 2 and the area value of the shot 3 into the meshes 2 and 3, whereby the area value of each mesh is supplemented cumulatively. As a result, as shown in the lower part of FIG. 1, the mesh 2 comes to have a larger area value than that of the mesh 1 or 3. Using this kind of exposure map thus makes it possible to reduce the exposure of the shot 2 so as to correct the proximity effect.

In carrying out the invention and according to one aspect thereof, there is provided an electron beam lithography system comprising: exposure map creating means which, based on positional relations between meshes dividing a region to be rendered by an electron beam on the one hand and shots to be rendered by the electron beam on the other hand, creates an exposure map by calculating an area density from a shot area included in each of the meshes; and proximity effect correcting means for correcting a level of exposure for each of the shots by referencing the exposure map so that each shot is exposed at the corrected level; wherein the exposure map creating means includes judging means for judging whether or not each shot straddles a plurality of meshes.

In a preferred structure according to the invention, based on positional relations between coordinates of two diagonally positioned end points of each shot on the one hand and mesh boundaries on the other hand, the judging means may judge whether the shot in question straddles the plurality of meshes. The exposure map creating means may preferably divide each shot straddling the plurality of meshes by boundaries of the meshes so that either area values or area densities of divided shots included in each mesh are added to the mesh in question.

In another preferred structure according to the invention, the electron beam lithography system may further comprise N×M memories for accommodating either area values or area densities of shots, N representing a maximum number of divided shots in a direction of one boundary of a given mesh, M denoting a maximum number of divided shots in a direction of another boundary of the mesh in question. This structure is preferred for its ability to boost processing speeds. If the area value of a given shot is divided into N×M portions and if the divided values were stored into a single memory, that memory would have to be accessed N×M times because area values vary in different meshes having obviously different addresses.

If N×M partial memories are provided with the same address, write operations are performed in a relatively easy manner, with the divided area values stored per shot and written simultaneously to adjacent addresses of each mesh. Upon retrieval, N×M data are required to be read simultaneously. The requirement is met by an adding function provided downstream of the partial memories. Preferably, when either an area value or an area density of each shot is divided for a plurality of meshes in order to store the divided values or densities into the memories, either the divided shot area values or the divided shot area densities included in each mesh may be set simultaneously to different addresses in different memories so that when data are to be retrieved from the memories, the data are read from the same address of all memories. The electron beam lithography system may further comprise a function for adding up a plurality of data retrieved from the same address in a plurality of the memories.

It is also possible to divide the region to be rendered by the electron beam into mesh groups each having N×M meshes, each mesh group being assigned a single address in each of N×M memories. Preferably, the electron beam lithography system may further comprise the N×M memories assigned the same addresses as those of the N×M meshes constituting each of the mesh groups dividing the region to be rendered by the electron beam. The system may also comprise, preferably, selecting means for selecting a desired memory as well as a desired address therein from among the N×M memories in accordance with the address of a given mesh.

In a further preferred structure according to the invention, the selecting means may select the memory into which to store either the area value or the area density of the mesh in question at an address (m, n) on the basis of a remainder from a formula of n/N and a remainder from a formula of m/M, the selecting means further selecting the address based on a quotient of the formula of n/N and on a quotient of the formula of m/M. With this preferred structure, a single memory may be selected by use of a bit string of up to (N×M)/2 bits starting from the least significant bit of a mesh address, and an address in the selected memory may be selected using higher-order bits than the (N×M)/2 bits.

According to another aspect of the invention, the electron beam lithography system has an exposure map made of N×M memories.

These and other objects, features and advantages of the invention will become more apparent upon a reading of the following description and appended drawings.

BRIEF DESCRIPTION OF THE DRAWINGS

FIG. 19 is a schematic view pointing out a deficiency of the conventional exposure map creating method;

DETAILED DESCRIPTION OF THE PREFERRED EMBODIMENTS

Preferred embodiments of this invention will now be described with reference to the accompanying drawings. In the description that follows, an electron beam lithography system for rendering fine circuit patterns on a semiconductor wafer will be shown as embodying the invention.

[First Embodiment]

Figure 1:
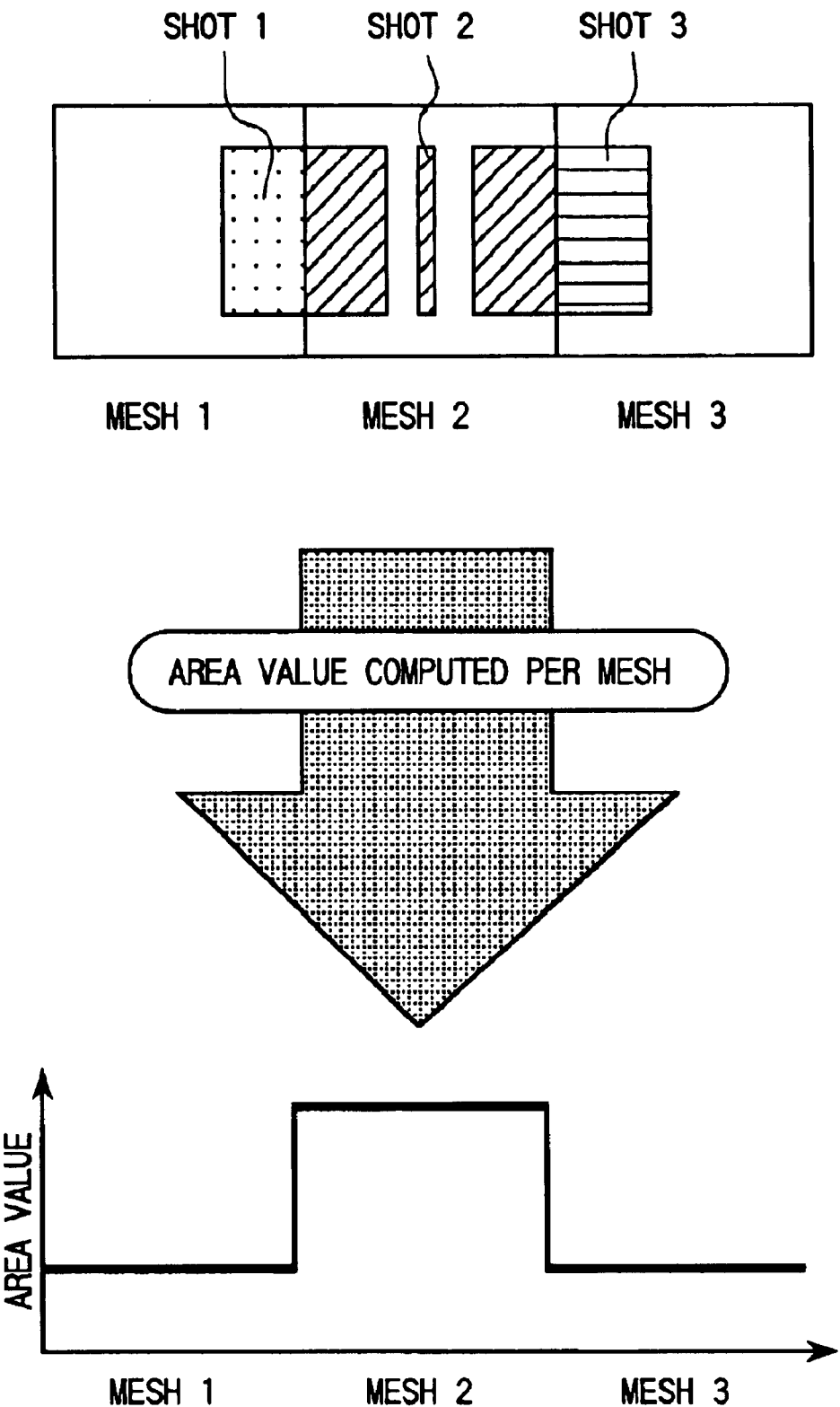
FIG. 1 is a conceptual view outlining the concept of an exposure map creating method according to this invention.
Figure 2:
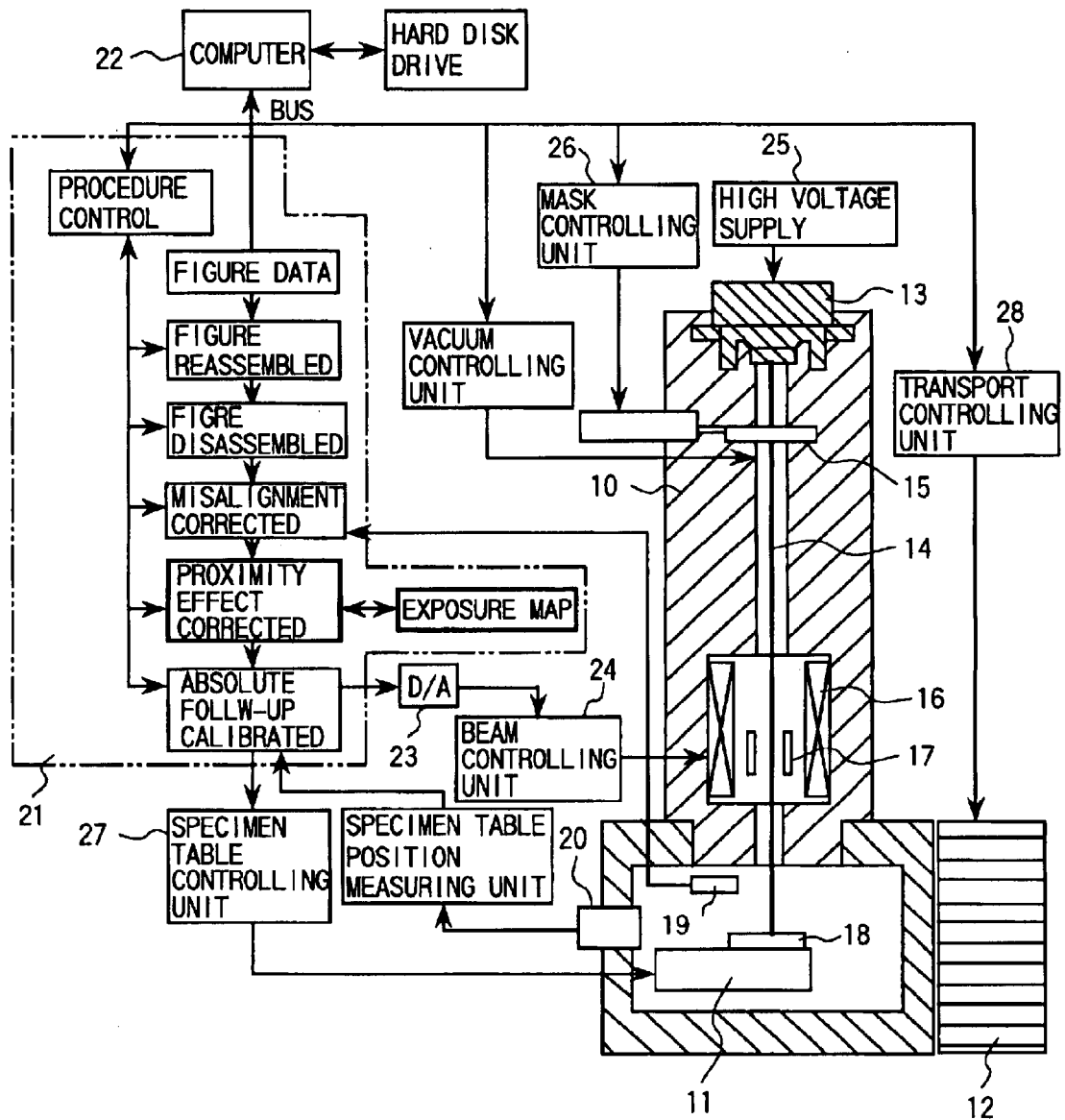
FIG. 2 is an overall schematic view of an electron beam lithography system embodying the invention.

FIG. 2 is a schematic view of an electron beam lithography system embodying the invention. A cross-sectional view in the right-hand portion of FIG. 2 comprises an electron beam enclosure 10, a specimen table 11 and a transporting unit 12. An electron gun 13 at the top of the electron beam enclosure 10 emits an electron beam 14 that is suitably shaped by lenses 16 inside. The electron beam 14 thus shaped is polarized by a polarizer 17 composed of an electromagnetic and an electrostatic polarizer. The polarized electron beam is irradiated to a target spot on a semiconductor wafer 18 placed on the specimen table 11. Several cross-sectional shapes of the irradiated electron beam 14 may be transcribed onto the wafer 18 by selecting a mask 15 appropriately.

The left-hand portion of FIG. 2 shows components of a system control computing section controlling the entire system and providing an interface with the outside. A group of functional blocks enclosed in a frame 21 constitutes a group of digital processing units for control purposes. These processing units convert rendering data from a computer 22 into polarization data about the electron beam in a continuous manner (i.e., on a pipeline basis) at a high speed. The individual processing units carry out the following processes:

(1) Figure Data Unit

A figure data unit stores compressed pattern data transferred from the computer 22.

(2) Figure Reassembling Unit

A figure reassembling unit reassembles the compressed pattern data into figure data.

(3) Figure Disassembling Unit

A figure disassembling unit replaces each reassembled figure with a shape (i.e., shot) that may be rendered by electron beam, thereby creating position, shape and exposure data about each shot.

(4) Alignment Correcting Unit

An alignment correcting unit monitors the wafer 18 for misalignment and distortion using a sensor 19, and makes corrections to compensate for any misalignment or distortion detected.

(5) Proximity Effect Correcting Unit

A proximity effect correcting unit corrects the proximity effect by first obtaining a unit pattern area map (i.e., exposure map) of a pattern to be rendered and by correcting the level of exposure for each shot with reference to the values in the exposure map.

(6) Absolute Follow-up Calibrating Unit

An absolute follow-up calibrating unit permits continuous rendering. Based on position data from a specimen table position measuring unit 20, this calibrating unit calculates the position of the polarized electron beam so that the electron beam 14 is kept irradiated precisely onto the target spot on the wafer 18, and corrects distorted polarization in the electron beam enclosure.

(7) Procedure Controlling Unit

A procedure controlling unit provides monitoring and controlling functions such as to keep the above units performing their processing smoothly.

Data coming from the above control-related units are converted from digital to analog format by a D/A converter 23. The converted data are sent to a beam controlling unit 24 that controls electromagnetic lenses as well as the electromagnetic and electrostatic polarizers. A high voltage supply 25 provides the electron gun 13 with power to generate acceleration voltages. A mask controlling unit 26 selects the shape of a mask 15. A specimen table controlling unit 27 controls movements of the specimen table 11 in the enclosure 10. The transporting unit 12, under control of a transport controlling unit 28, loads the wafer 18 into the enclosure. The units exchanging their signals through an interface may be controlled by computer.

Figure 3:
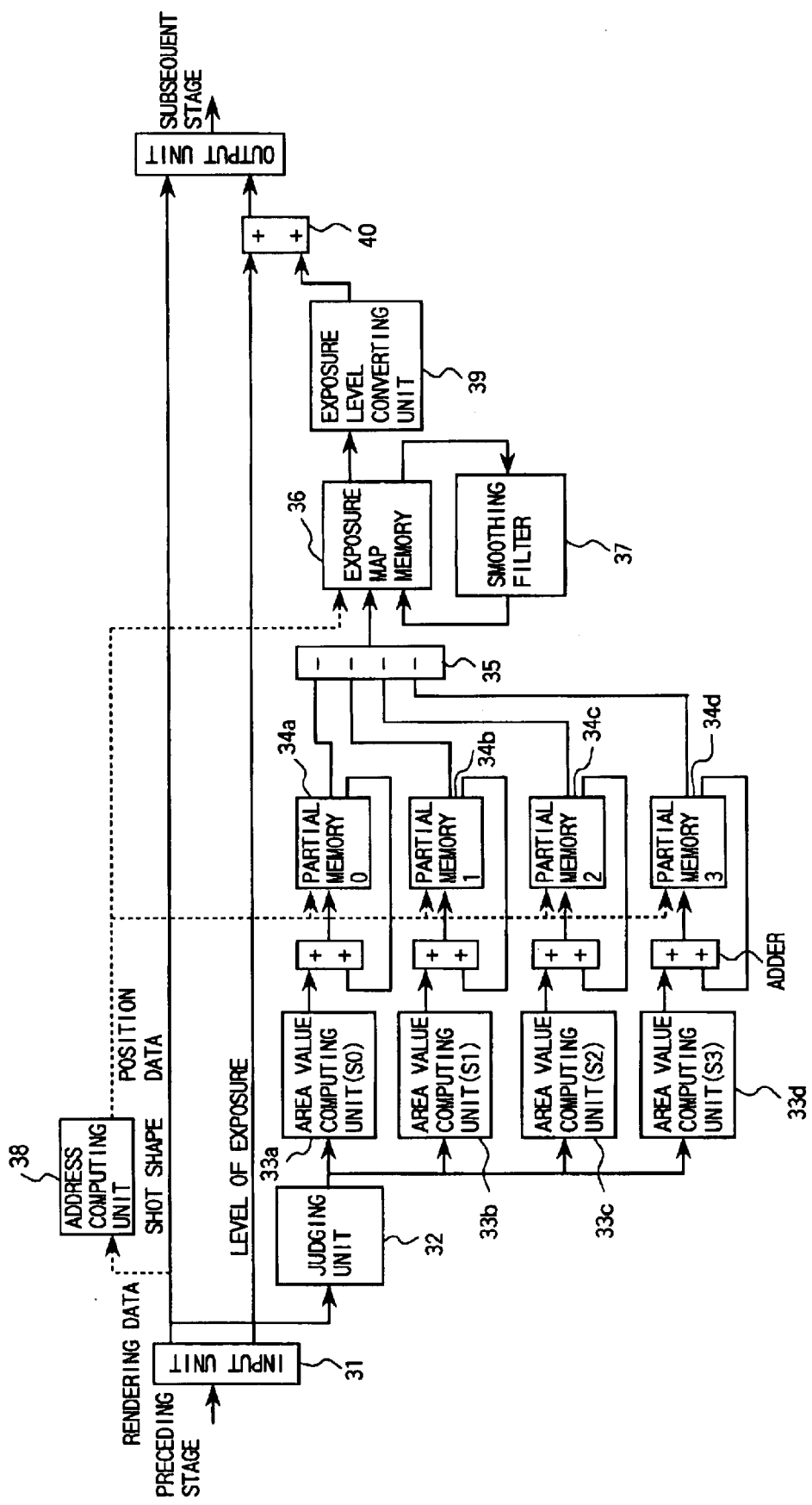
FIG. 3 is a block diagram of a typical proximity effect correcting unit of the invention.

FIG. 3 is a block diagram of a typical proximity effect correcting unit of the invention. This proximity effect correcting unit differs from its counterpart in the way in which exposure maps are created. An exposure map for mock rendering is created by first having rendering data sent from the preceding stage. An input unit 31 divides the rendering data into meshes of a predetermined size each. A judging unit 32 computes positional relations between each shot and meshes based on the position and shape of the shot in question, and makes a judgment accordingly.

Illustratively, if each shot is smaller than any one of the meshes involved, the judging unit 32 reaches one of the following four judgments that may be called conditions:

Condition 1

The shot in question is included in a mesh.

Condition 2

The shot exceeds a mesh boundary in the X direction only.

Condition 3

The shot exceeds a mesh boundary in the Y direction only.

Condition 4

The shot exceeds mesh boundaries in both the X and the Y directions.

In each of the above conditions, the judging unit 32 computes shot areas divided by mesh boundaries and included in each mesh, and writes the computed values to memory locations. Obviously, the data coming from the preceding stage are unpredictable and may represent any one of the four conditions above. Whereas the data falling under the condition 1 alone are accommodated with no problem by a single memory, the data under the condition 4 cannot be processed on a pipeline basis using one memory because one shot has been divided into four meshes. In the latter case, there is no avoiding the slowing-down of the processing. This snag is circumvented by the inventive proximity effect correcting unit utilizing four partial memories 34a through 34d (memories 0 through 3). Each of the four partial memories 34a through 34d has its own address (m, n).

As will be described later in more detail, area values S0, S1, S2 and S3 calculated by area value computing units 33a through 33d are stored simultaneously into the four partial memories 34a through 34d, whereby the processing is carried out rapidly on a pipeline basis. Addresses at which to store the area values S0 through S3 are given as (m, n+1), (m+1, n) and (m+1, n+1) adjacent to address (m, n) of the mesh containing illustratively the bottom left end point of the shot in question. For conditions such as the condition 1 under which no area value is computed, zero is written to addresses (m, n+1), (m+1, n) and (m+1, n+1) of the partial memories 1, 2 and 3 respectively (S1=0, S2=0, S3=0).

It is possible to calculate levels of exposure by referring to the area values stored in the partial memories 34a through 34d. Generally, the flow of data from the preceding stage is rapid enough to necessitate the use of S-RAMs for the partial memories 34a through 34d. At present, it is difficult for such an S-RAM makeup to accommodate the whole rendering data. Preferably, the area values placed temporarily in the memories 34a through 34d should then be transferred to an exposure map memory (e.g., D-RAM) 36 capable of accommodating large quantities of data.

Different data are found in the four partial memories 34a through 34d at a single address thereof. Thus when data are to be transferred form the partial memories 34a through 34d to the exposure map memory 36, the data are retrieved from the same address of the four partial memories and are added up by an adding circuit 35 in the subsequent stage totaling the data for each address. The totaled data are transferred to the exposure map memory 36. In this manner, one set of data is associated with one address.

The data stored in the exposure map memory 36 are subjected to such processes as smoothing by a smoothing filter 37 in order to simulate primary and secondary scattering of electrons. The data thus processed are again placed into the exposure map memory 36 whereby a desired exposure map is created. When actual rendering is performed, the same data are again transmitted from the preceding stage.

Given position and shape data about each shot, an address computing unit 38 calculates an address in the exposure map 36. The area value of the address is converted simultaneously to a level of exposure by an exposure level converting unit 39, and an adder 40 adds or subtracts the converted value to or from the level of exposure of each shot for correction. At this point, the address in the exposure map 36 is calculated by the address computing unit 38 with reference to the center of the shot in question.

In the present example, the four partial memories 34a through 34d are used because the size of shots is assumed not to exceed that of meshes. The number of patterns may vary depending on the size of the largest shot. For example, if the maximum shot size is 1.5 times larger than the mesh size, nine partial memories are provided because conditions need to be considered over a 3×3 mesh region. In this manner, furnishing a suitable number of partial memories in keeping with the maximum shot size makes it possible for the proximity effect correcting unit of FIG. 3 to correct the proximity effect where the relationship between the maximum shot size and the mesh size varies.

Figure 4:
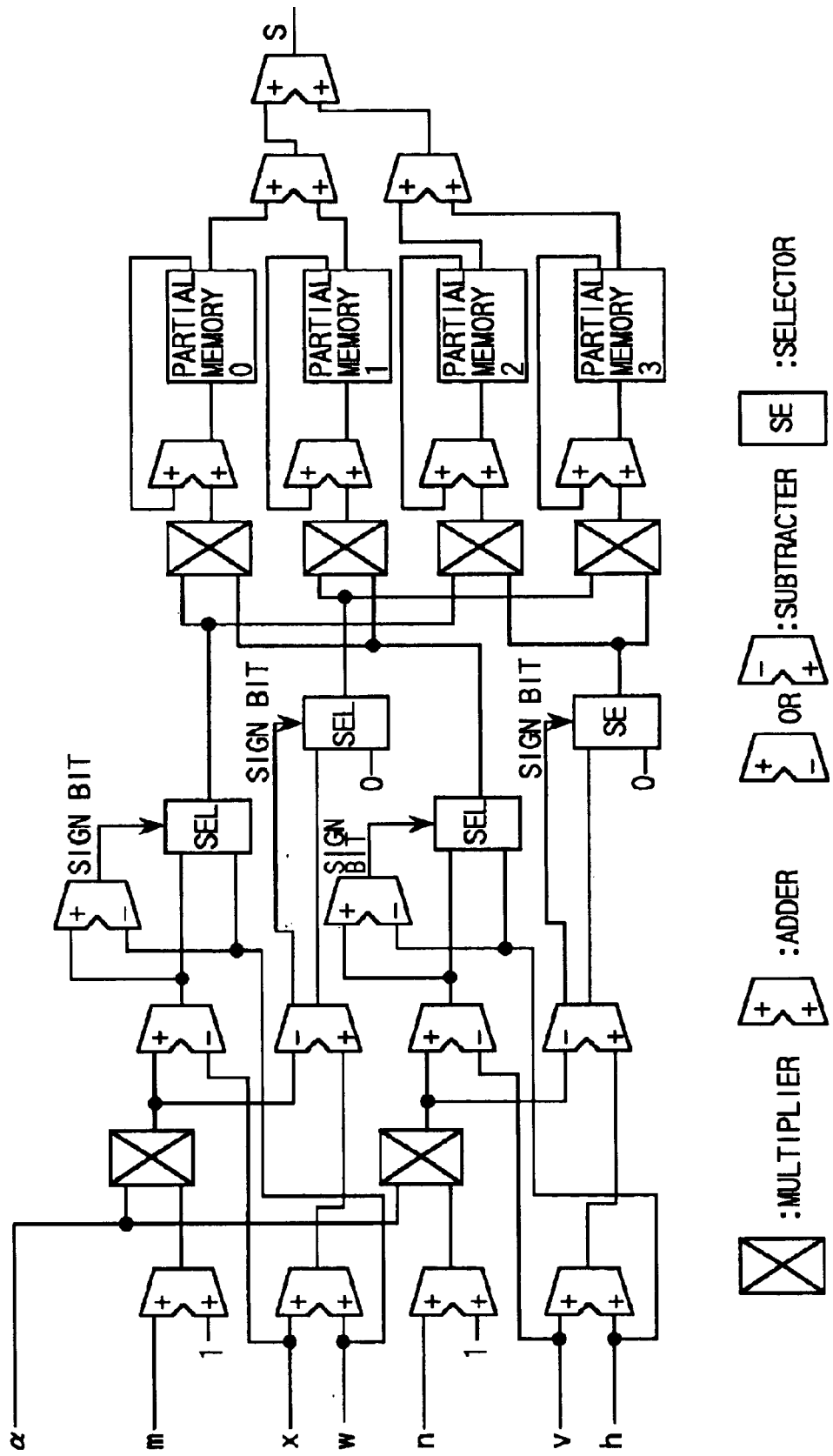
FIG. 4 is a block diagram partially illustrating the setup of FIG. 4 in more detail.
Figure 5:
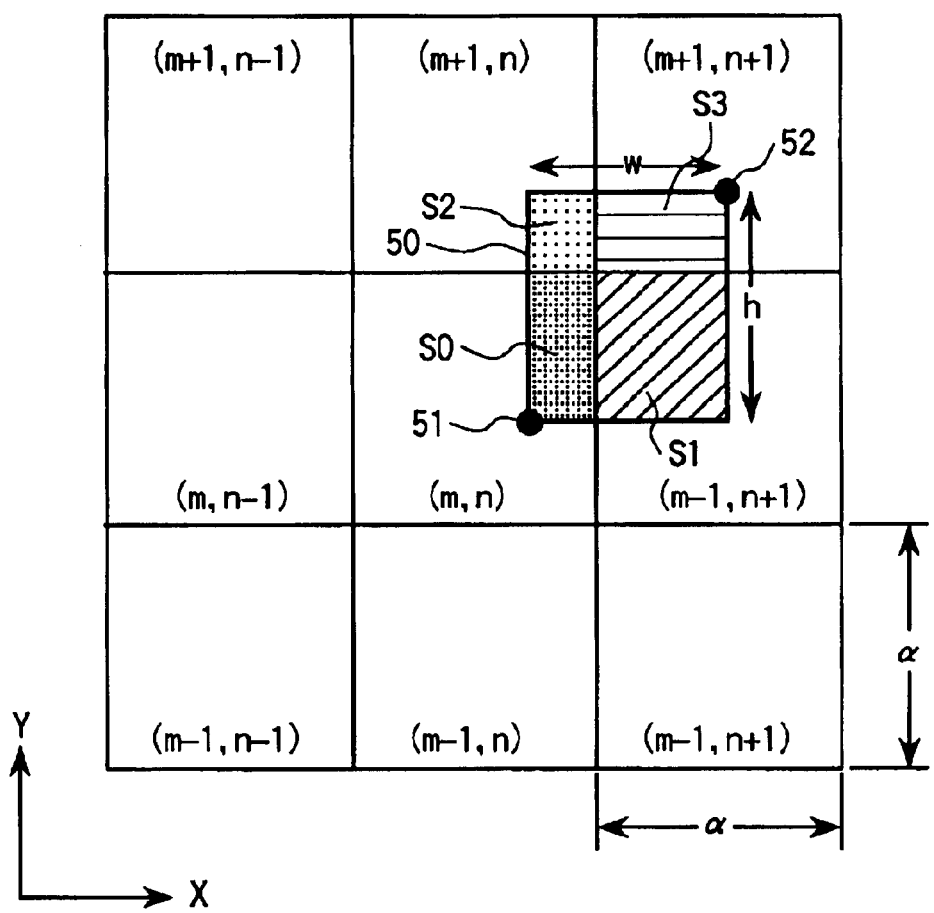
FIG. 5 is a schematic view depicting positional relations between a shot and meshes.

With reference to FIGS. 4 and 5 and using simulations, an illustrative description is made below of judgments formed by the judging unit 32 and of area value calculations made by the area value computing units 33a through 33d (shown included in the block diagram of FIG. 3). FIG. 4 is a block diagram of a typical circuit that divides the area of the shot in question and adds up the divided area values by judging positional relations between the position and shape of rendering data (shot data in this case) on the one hand and mesh boundaries on the other hand. FIG. 5 is a schematic view depicting positional relations between a shot 50 and meshes. Judgments are formed in the setup of FIG. 5 by use of a bottom left end point 51 and a top right end point 52 of the shot 50.

The parameters shown in FIGS. 4 and 5 include position data (x, y) about the bottom left end point 51 of the shot 50 (in FIG. 5), shape data "w" and "h" on the shot 50, and a mesh size of α. A rectangular shot is used for the purpose of simplifying position and shape data. Reference characters "x" and "y" stand for an X and a Y coordinate, respectively, of the bottom left end point 51 belonging to the shot 50. Reference characters "w" and "h" denote a width and a height of the rectangular shot 50 respectively. Each mesh is assumed to be a square on condition that α≧w and α≧h.

How the circuit of FIG. 4 works will now be described using the above parameters. Address (m, n) of the mesh containing the shot 50 is defined by expression (1) below with respect to the position where the bottom left end point 51 exists. The definition is adopted with a view to simplifying the conditions with reference to an end point. In the expression below, [I] means a maximum integer not exceeding I.

$$m=[x/\alpha], n=[y/\alpha] \quad (1)$$

It is in one of four conditions (1 through 4 described below) that the bottom left end point 51 of a given shot 50 is included in the mesh having address (m, n) in FIG. 5. As shown in FIG. 4, the judging unit 32 makes a judgment on each of the conditions using seven parameters α, m, x, w, n, y, h coming from the input unit 31, and computes as shown below area values S0 through S3 for the meshes having addresses (m, n), (m, n+1), (m+1, n) and (m+1, n+1). That is, the values S0 through S3 denote the shot areas included in the meshes (m, n), (m, n+1), (m+1, n) and (m+1, n+1) respectively. In any of the four conditions, the area values S0 through S3 are written to addresses of partial memories as indicated below. If any address of a partial memory to which to write a newly computed area value has area value data already, the new value is added to the existing data.

S0→written to address (m, n) of partial memory 0
S1→written to address (m, n+1) of partial memory 1
S2→written to address (m+1, n) of partial memory 2
S3→written to address (m+1, n+1) of partial memory 3

Condition 1

This is a case where the top right end point 52 of the shot 50 is included in the mesh (m, n), i.e., where (n+1)·α−x≧w and (m+1)·α−y ≧h.
S0=w·h
S1=0
S2=0
S3=0

Condition 2

This is a case where the top right end point 52 of the shot 50 is included in the mesh (m, n+1), i.e.,
where (n+1)·α−x<w and (m +1)·αy≧h.
S0=[(n +1)·α−x]·h
S1=[x+w−(n+1)·α]h
S2 0
S3 0

Condition 3

This is a case where the top right end point 52 of the shot 50 is included in the mesh (m+b 1, n), i.e, where (n+1)·α−x≧w and (m+1)·α−y<h.
S0=w·[(m+1)·α−y]
S1=0
S2=w·[y+h−(m+1)·α]
S3=0

Condition 4

This is a case where the top right end point 52 of the shot 50 is included in the mesh (m+, n+), i.e., where (n+1)·α−x<w and (m+1)·α−y<h.

S0=[(n+1)·α−x]·[(m+1) ·α−y]
S1=[x+w·(n+1)·α]·[(m+1) ·α−y]
S2=[(n+1)·α−x]·[y+h−(m+1)·α]
S3=[(x+w−(n+1)·α]·[y+h−(m+1)·α]

Figure 6:
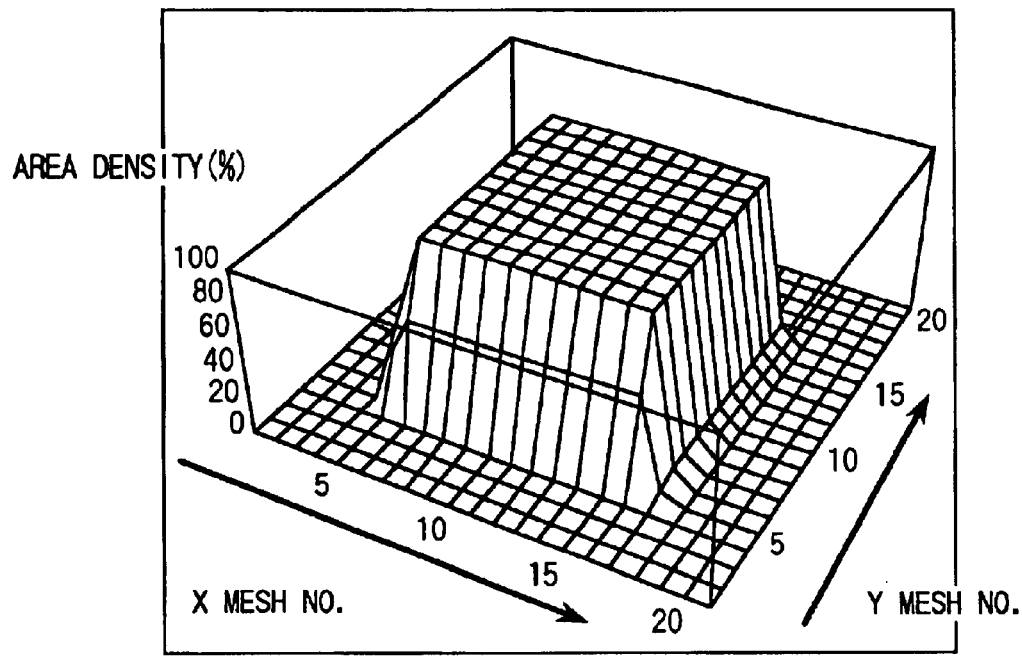
FIG. 6 is a graphic representation explaining exposure map data created by the inventive system.
Figure 20:
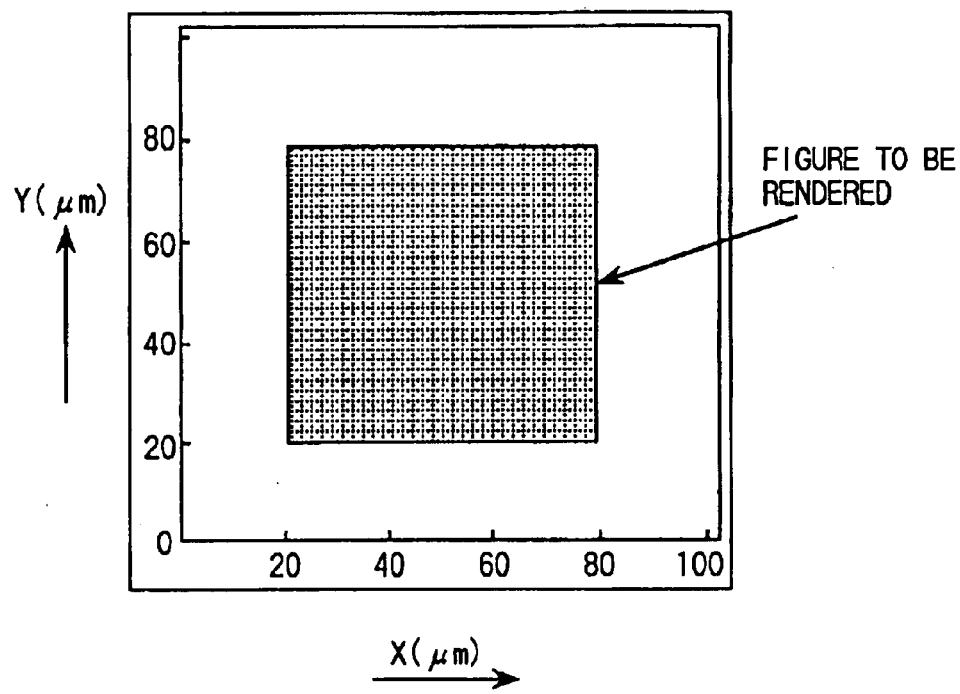
FIG. 20 is a graphic representation showing a shape taken by rendering data used for simulation.

FIG. 6 is a graphic representation of an exposure map shown three-dimensionally and created by disassembling rendering data on a 60 μm×60 μm square in FIG. 20 using a 3.0 μm×3.0 μm shot. For this exposure map, calculations are made over a range of 20×20 meshes each measuring 5.12 μm×5.12 μm. The acquired values are each expressed as a percentage of the shot area included in each mesh, i.e., as an area ratio.

Figure 21:
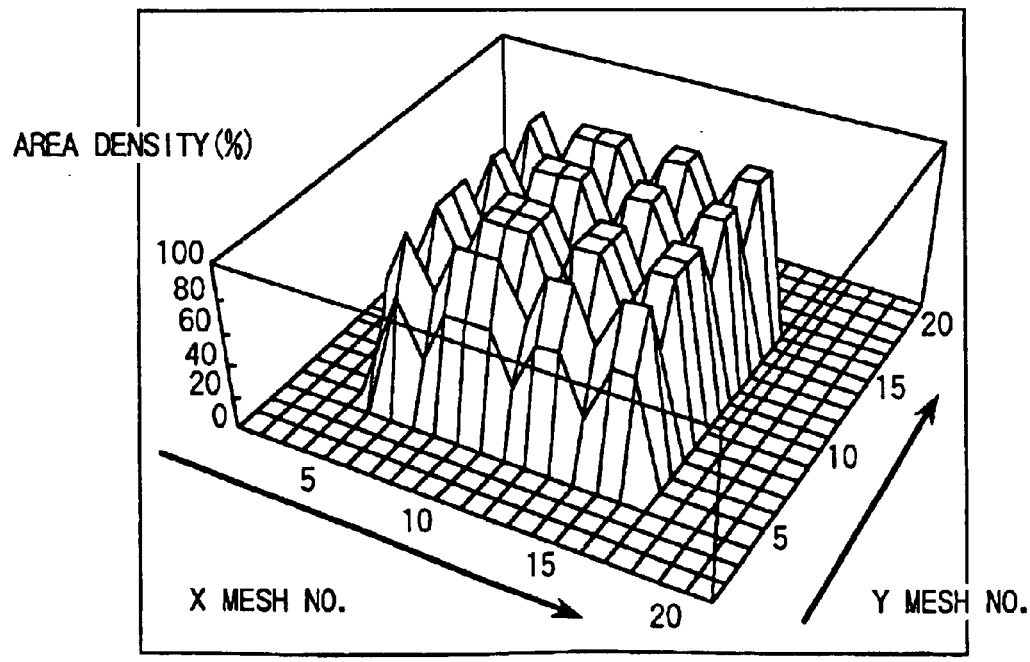
FIG. 21 is a graphic representation depicting exposure map data created by the conventional method.

A comparison of FIG. 6 with FIG. 21 indicates a uniform area ratio distribution obtained inventively over the region where the figure exists. The results remain the same when the shot size is set for 0.64 μm×0.64 μm or when the mesh size is 5.12μm×5.12μm. Exposure maps may thus be created independently of the shot size as long as the mesh size is not exceeded by the shot. In other words, highly precise exposure maps are created without having to reduce the shot size as has been the case conventionally. According to the invention, the time required for the processing is shortened while precision is maintained.

When the exposure process is performed with the proximity effect corrected by use of an inventive exposure map, patterns are exposed in high degrees of precision. Although it has been shown above that the judgments and area value computations are made by hardware on a pipeline basis, this is not limitative of the invention. Similar judgments and calculations may also be accomplished on a software basis.

The method outlined above will now be described in more detail with reference to FIG. 7. The emphasis will be on the reasons why four partial memories are employed and why an adding circuit is incorporated to integrate four items of data held in the four partial memories (i.e., partial memories 34a through 34d explained with reference to FIGS. 3 and 4).

Figure 7:
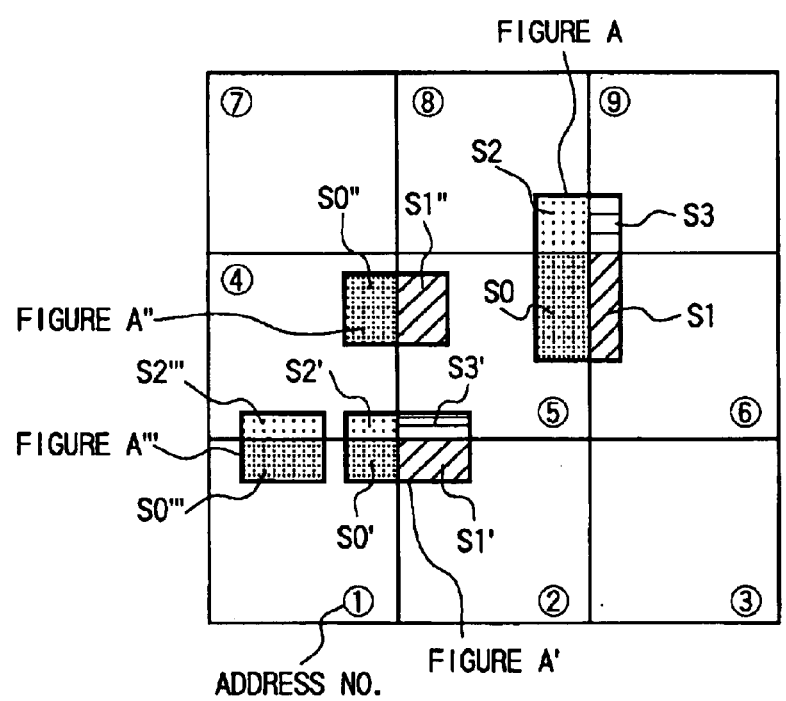
FIG. 7 is a schematic view showing how shots are divided by mesh boundaries.

Suppose that an exposure map has nine meshes (whose addresses are indicated by encircled numerals) as shown in FIG. 7, and that four shot data A, A', A" and A'" have been input as indicated. A figure represented by the shot data A straddles the meshes having addresses 5, 6, 8 and 9. Likewise, a figure denoted by the shot data A' straddles the meshes with addresses 1, 2, 4 and 5. A figure defined by the shot data A" straddles the meshes with addresses 4 and 5, and a figure of the shot data A'" straddles the meshes having addresses 1 and 4. Data to be written to the partial memories in this makeup are shown in Table 1.

TABLE 1

| | | MEMORY 0 | MEMORY 1 | MEMORY 2 | MEMORY 3 |
|---|---|---|---|---|---|
| AD-DRESS | 1 | S0' + S0'" | | | |
| | 2 | | S1' | | |
| | 3 | | | | |
| | 4 | S0" | | S2' + S2'" | |
| | 5 | S0 | S1" | | S3' |
| | 6 | | S1 | | |
| | 7 | | | | |
| | 8 | | | S2 | |
| | 9 | | | | S3 |

Illustratively, the shot A has its area value S0 written to address 5 of memory 0, its area value S1 written to address 6 of memory 1, its area value S2 written to address 8 of memory 2, and its area value S3 written to address 9 of memory 3. It should be noted that the shot area values are stored at different addresses in different memories. In the case of the shots A' and A'", their bottom left end point is included in the same mesh. For that reason, the area values S0" and S0'" are written to the same address of the same memory and so are the area values S2' and S2'".

In the memories thus grouped, one signal address may have different values written thereto as shown in Table 1. This means that simply accessing one address in one memory does not provide a correct area value included in a mesh. The area value included in each mesh should thus be computed by reading area values from the same address in the four memories and by adding up the retrieved values. The calculations are performed on a pipeline basis by use of an adding circuit which is located downstream of the partial memories for the purpose of integrating four pieces of data.

[Second Embodiment]

With the first embodiment shown in FIGS. 3 and 4, simplified address assignments make it relatively easy to build circuitry. However, because each address is assigned to four memories in replicated fashion, the embodiment requires four times as much storage space as that of the single memory setup. Increased memory requirements signify a growing number of circuit elements needed, which makes mounting of component parts on the substrate more difficult and incurs higher costs than before. The second embodiment, by contrast, provides an appreciable saving in the total amount of partial memories by dividing exposure map addresses into four portions each allocated to a partial memory.

Figure 9:
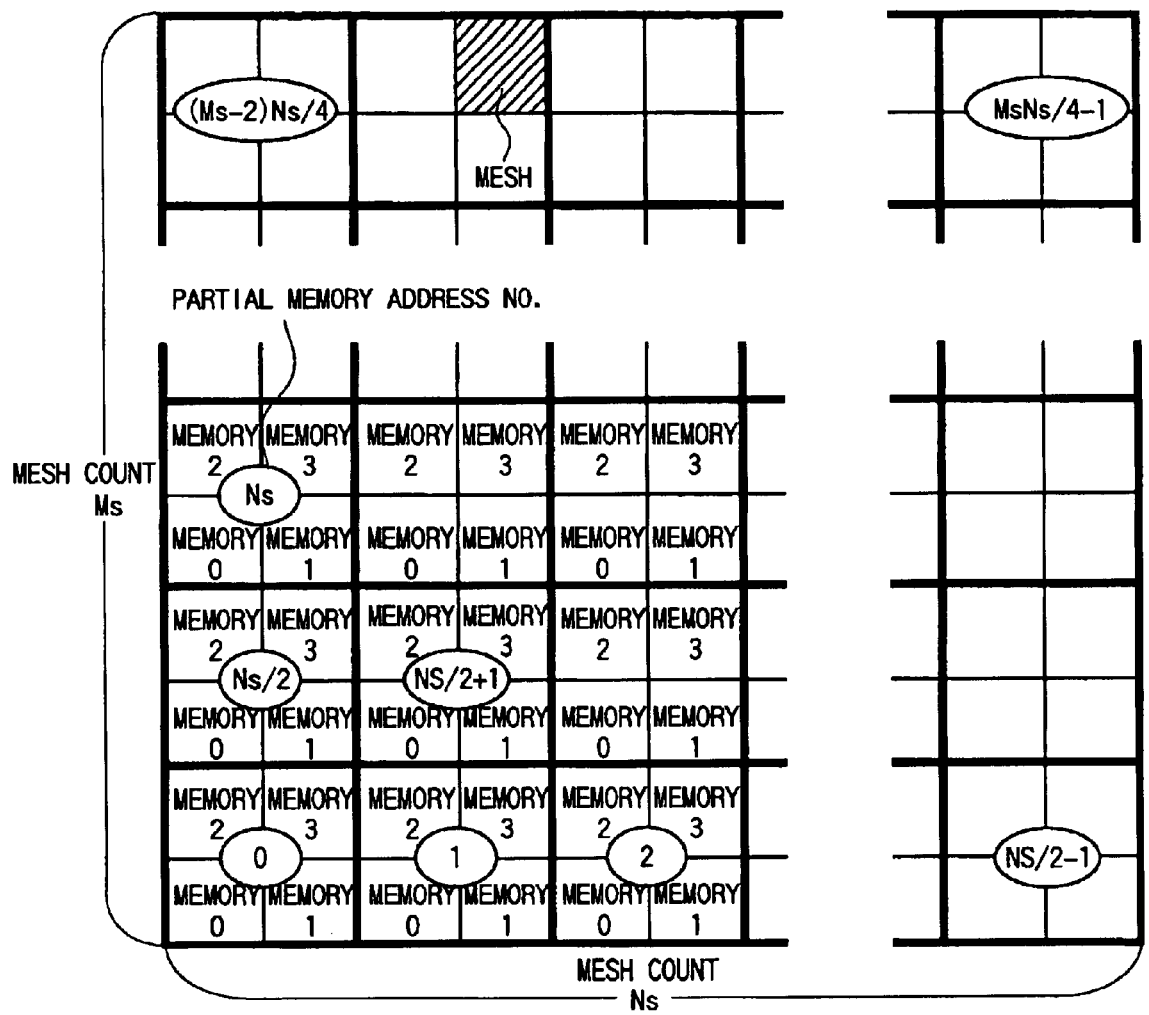
FIG. 9 is a schematic view of a map structure with each address representative of four meshes.

With reference to FIG. 9 showing relations between meshes on the one hand and partial memories on the other hand, description will now be made in detail of the memories and their addresses for accommodating area values S0, S1, S2 and S3 of each shot divided between meshes. Four memories are used to retain different data. It is thus necessary to regard each address as representative of four meshes so that their data will not conflict.

FIG. 9 shows a partial region made of $M_o \times N_a$ meshes in groups of four, with each mesh group assigned an address. Each encircled numeral corresponding to a group of four meshes represents a partial memory address. Of the four meshes given an identical address, the bottom left mesh is allocated to the partial memory 0, the bottom right mesh to the partial memory 1, the top left mesh to the partial memory 2, and the top right mesh to the partial memory 3. When area density data on each mesh are to be stored, a normal mesh address is halved and the halved addresses are used as the addresses of partial memories (0 through 3). If a shot straddles a boundary where addresses change from one partial memory to another, the memories need to be switched so as to accommodate the area values, and the addresses also need to be changed.

If a partial memory address is assumed to be (M, N) and if the remainder involved is assumed to be (M LSB, N LSB), these values are defined by expression (2) as follows:

$$M=\text{Floor}[m(i)/2], M_{LSB}=\text{Mod}[m(i)/2]$$
$$N=\text{Floor}[n(i)/2], N_{LSB}=\text{Mod}[n(i)/2] \quad (2)$$

where, Floor[a/b] stands for the quotient (integer) of a/b and Mod[a/b] for the remainder (integer) of a/b.

Figure 10:
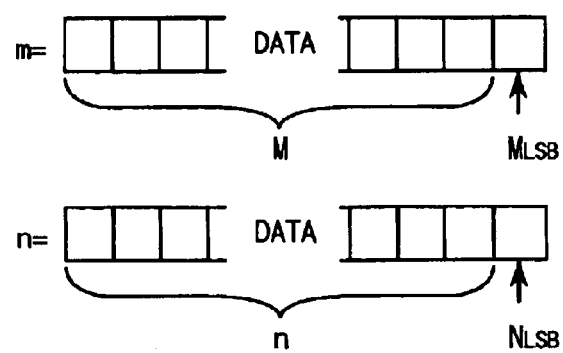
FIG. 10 is a schematic view explaining how addresses are allocated in the map structure with each address representative of four meshes.

In other words, a mesh address (m, n) is defined by expression (3) given below. The address may be expressed by data with the least significant bits given as (M LSB, N LSB) as shown in FIG. 10.

$$m(i)=2\times M+M_{LSB} \; n(i)=2\times N+N_{LSB} \quad (3)$$

The numeral of each partial memory and its address are designated by use of the above parameters. A point of reference is assumed to be located in the mesh including the bottom left end point of a shot. Judgments are then formed about address (m, n) of the mesh in which the bottom left end point of the shot is found. In that case, there are provided four conditions in which to divide the area value of the shot in question and to store the divided values. The divided shot area values S0, S1, S2 and S3 are written to designated addresses in designated partial memories as will be shown below. The values S0, S1, S2 and S3 stand for the area values included in the meshes (m, n), (m, n+1), (m+1, n) and (m+1, n+1) respectively.

In the description that follows, a partial memory address is given as (M, N) under conditions (i) through (iv) for purpose of simplification and illustration. In practice, the address of a given partial memory is defined by expression (4) below.

$$(\text{Partial memory address})=M\times(N_s/2)+N \quad (4)$$

where M=0, 1, 2, . . . , $M_s/2$ and N=0, 1, 2, . . . , $N_a/2$.

Condition (i)

Figure 11:
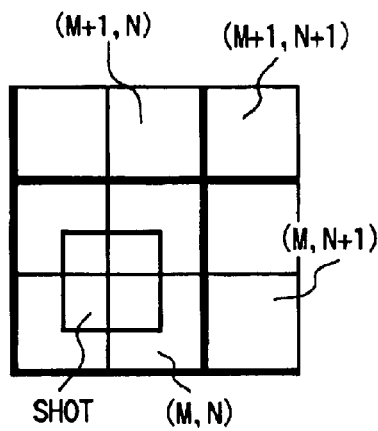
FIG. 11 is an explanatory view of an address allocation condition 1 for the map structure with each address representative of four meshes.

This is a case where the entire shot is included in a partial memory with address (M, N) such as is shown in FIG. 11, i.e., where the least significant bits of (m, n) are both zero, or {M LSB=0}∩{{N LSB=0}. In this case, the area values S0, S1, S2 and S3 are written to the partial memory addresses designated as shown in Table 2.

TABLE 2

|  |  | PARTIAL MEMORY | ADDRESS |
|---|---|---|---|
| AREA VALUE | S0 | PARTIAL MEMORY 0 | (M, N) |
|  | S1 | PARTIAL MEMORY 1 | (M, N) |
|  | S2 | PARTIAL MEMORY 2 | (M, N) |
|  | S3 | PARTIAL MEMORY 3 | (M, N) |

Condition (ii)

Figure 12:
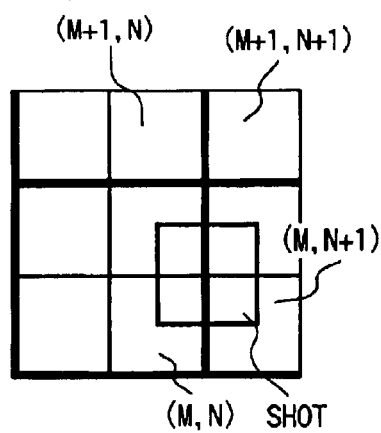
FIG. 12 is an explanatory view of an address allocation condition 2 for the map structure with each address representative of four meshes.

This is a case where the shot straddles partial memories with addresses (M, N) and (M, N+1) such as is shown in FIG. 12, i.e., where the least significant bits of "m" and "n" are 0 and 1 respectively, or {M LSB=0}∩{{N LSB=1}. In this case, the area values S0, S1, S2 and S3 are written to the partial memory addresses designated as shown in Table 3.

TABLE 3

|  |  | PARTIAL MEMORY | ADDRESS |
|---|---|---|---|
| AREA VALUE | S0 | PARTIAL MEMORY 1 | (M, N) |
|  | S1 | PARTIAL MEMORY 0 | (M, N + 1) |
|  | S2 | PARTIAL MEMORY 3 | (M, N) |
|  | S3 | PARTIAL MEMORY 2 | (M, N + 1) |

Condition (iii)

Figure 13:
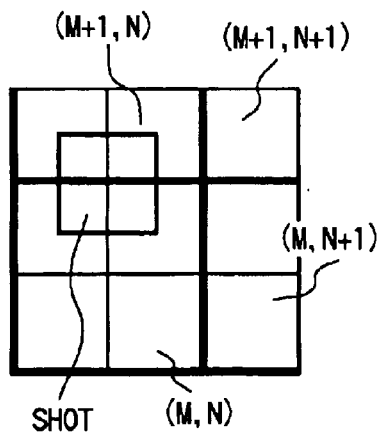
FIG. 13 is an explanatory view of an address allocation condition 3 for the map structure with each address representative of four meshes.

This is a case where the shot straddles partial memories with addresses (M, N) and (M+1, N) such as is shown in FIG. 13, i.e., where the least significant bits of "m" and "n" are 1 and 0 respectively, or {M LSB=1}∩{{N LSB=0}. In this case, the area values S0, S1, S2 and S3 are written to the partial memory addresses designated as shown in Table 4.

TABLE 4

|  |  | PARTIAL MEMORY | ADDRESS |
|---|---|---|---|
| AREA VALUE | S0 | PARTIAL MEMORY 2 | (M, N) |
|  | S1 | PARTIAL MEMORY 3 | (M, N) |
|  | S2 | PARTIAL MEMORY 0 | (M + 1, N) |
|  | S3 | PARTIAL MEMORY 1 | (M + 1, N) |

Condition (iv)

Figure 14:
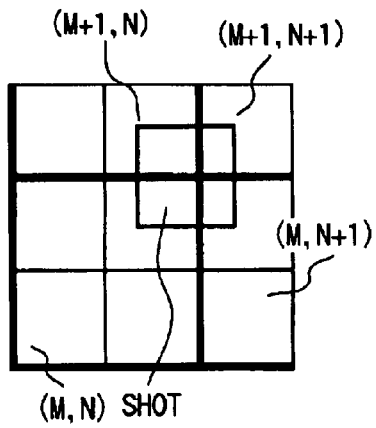
FIG. 14 is an explanatory view of an address allocation condition 4 for the map structure with each address representative of four meshes.

This is a case where the shot straddles all for partial memories such as is shown in FIG. 14, i.e., where the least significant bits of "m" and "n" are both 1, or {M LSB= 1}∩{{N LSB=1}. In this case, the area values S0, S1, S2 and S3 are written to the partial memory address designated as shown in Table 5.

TABLE 5

|  |  | PARTIAL MEMORY | ADDRESS |
|---|---|---|---|
| AREA VALUE | S0 | PARTIAL MEMORY 3 | (M, N) |
|  | S1 | PARTIAL MEMORY 2 | (M, N + 1) |
|  | S2 | PARTIAL MEMORY 1 | (M + 1, N) |
|  | S3 | PARTIAL MEMORY 0 | (M + 1, N + 1) |

Table 6 below summarizes the partial memory assignments relative to the area values shown illustratively above.

TABLE 6

| $M_{LSB}$ | $N_{LSB}$ | PARTIAL MEMORY 0 | PARTIAL MEMORY 1 | PARTIAL MEMORY 2 | PARTIAL MEMORY 3 |
|---|---|---|---|---|---|
| 0 | 0 | S0 | S1 | S2 | S3 |
| 0 | 1 | S1 | S0 | S3 | S2 |
| 1 | 0 | S2 | S3 | S0 | S1 |
| 1 | 1 | S3 | S2 | S1 | S0 |

Figure 15:
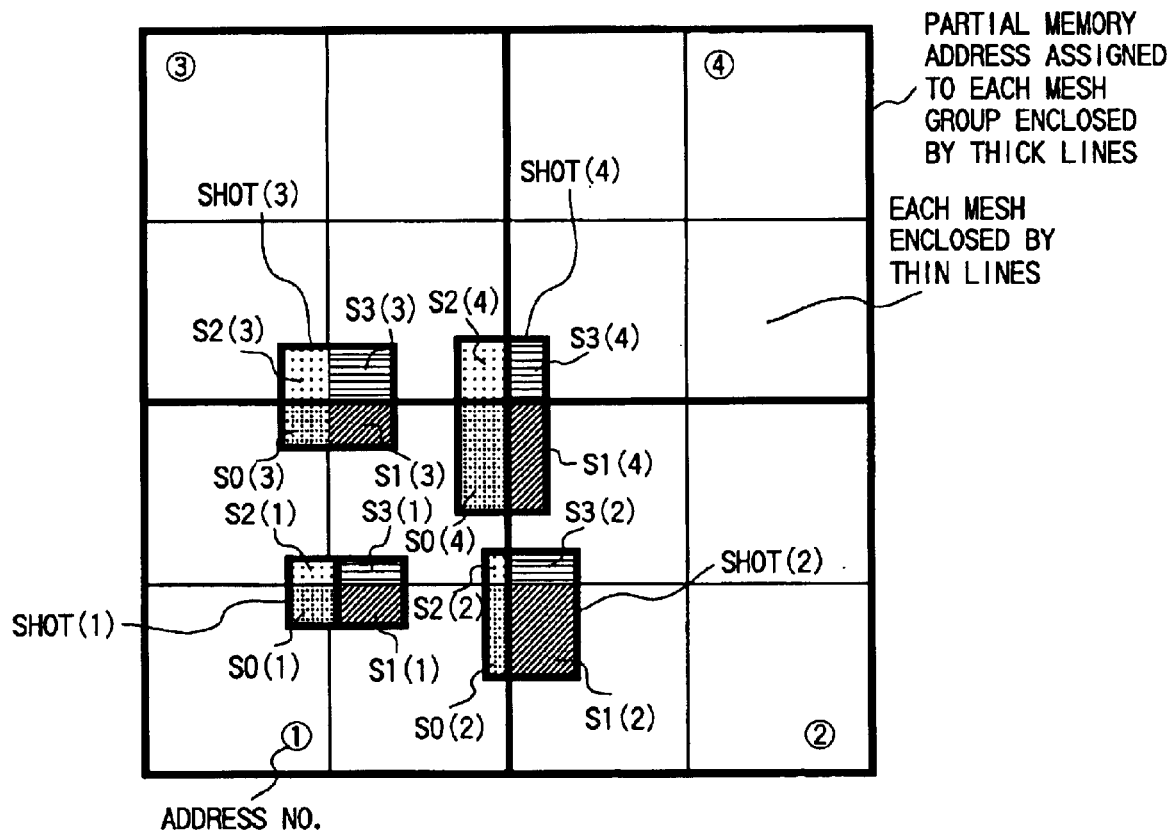
FIG. 15 is a schematic view explaining how area values divided by mesh boundaries are allocated to partial memories for area value accommodation.
Figure 16:
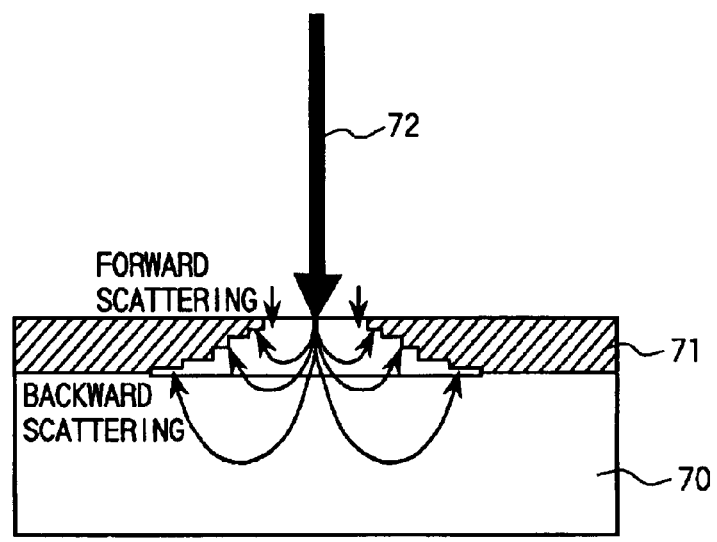
FIG. 16 is a schematic view depicting how electrons are typically scattered by an electron beam.
Figure 18:
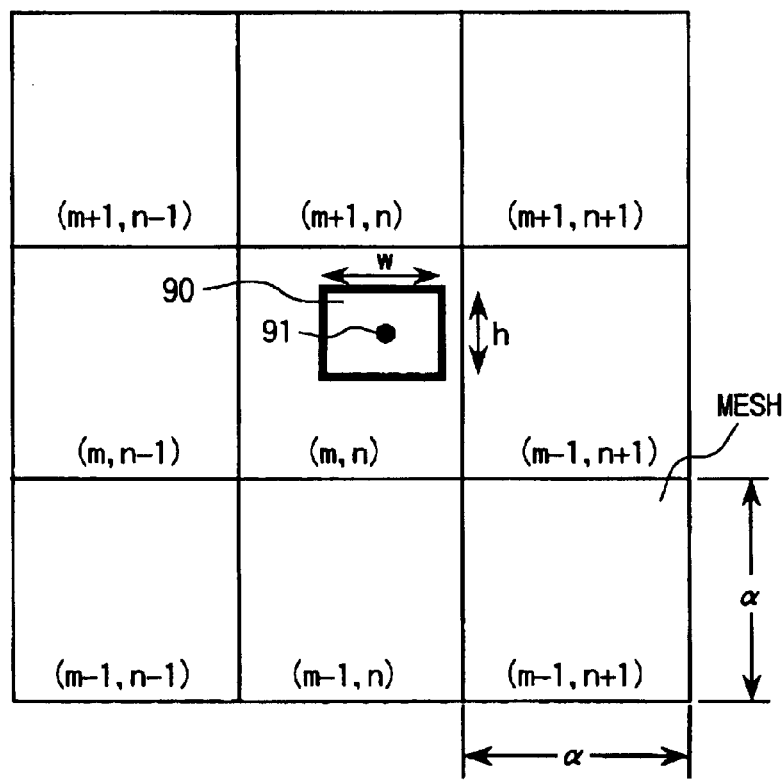
FIG. 18 is an explanatory view illustrating the principle of a conventional exposure map creating method.
Figure 17:
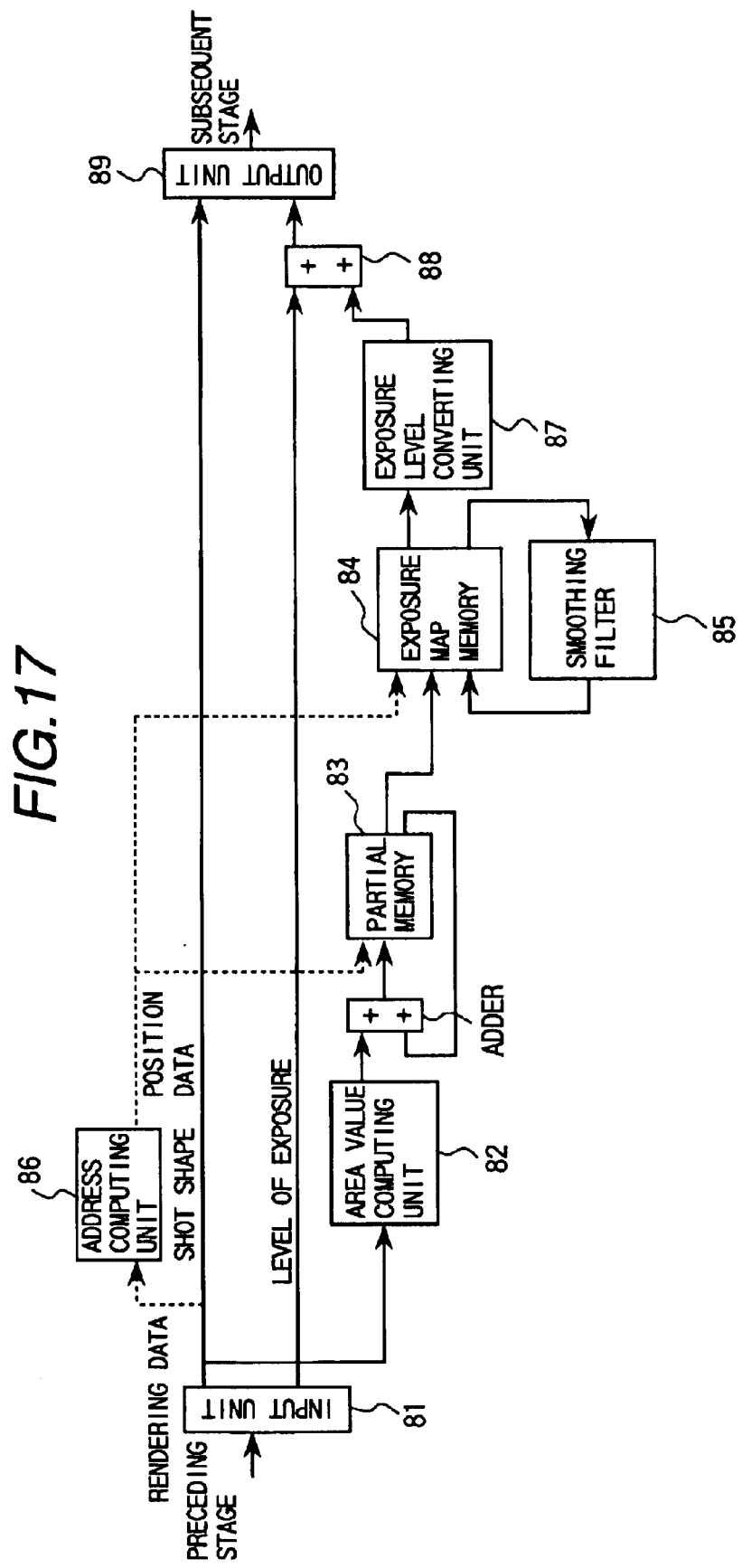
FIG. 17 is a schematic block diagram of a conventional proximity effect correcting unit.

FIG. 15 schematically depicts how area values divided by mesh boundaries are typically allocated to partial memories. In FIG. 15, a simplified map of 4×4 meshes is shown containing shots 1 through 4. If the map is assumed to be divided into groups of 2×2 meshes, then the partial memories are given four addresses (①through ④). In FIG. 15, each region enclosed by thin lines is a mesh, and each region enclosed by thick lines is covered by a partial memory address. If it is assumed that a shot "n" is divided by mesh boundaries into areas whose values are S0(n), S1(n), S2(n) and S3(n), then these area values are written to addresses of partial memories as designated in Table 7 that follows. Illustratively, the area of the shot 4 is divided so that the divided area values are stored into the memories as shown below.

S0(4)→written to address ① of partial memory 3
S1(4)→written to address ② of partial memory 2
S2(4)→written to address ③ of partial memory 1
S3(4)→written to address ④ of partial memory 0

TABLE 7

|  |  | PARTIAL MEMORY 0 | PARTIAL MEMORY 1 | PARTIAL MEMORY 2 | PARTIAL MEMORY 3 |
|---|---|---|---|---|---|
| ADDRESS | 1 | S0 (1) | S1 (1) + S0 (2) | S2 (1) + S0 (3) | S3 (1) + S2 (2) + S1 (3) + S0 (4) |
|  | 2 | S1 (2) | 0 | S3 (2) + S1 (4) | 0 |
|  | 3 | S2 (3) | S3 (3) + S2 (4) | 0 | 0 |
|  | 4 | S3 (4) | 0 | 0 | 0 |

Figure 8:
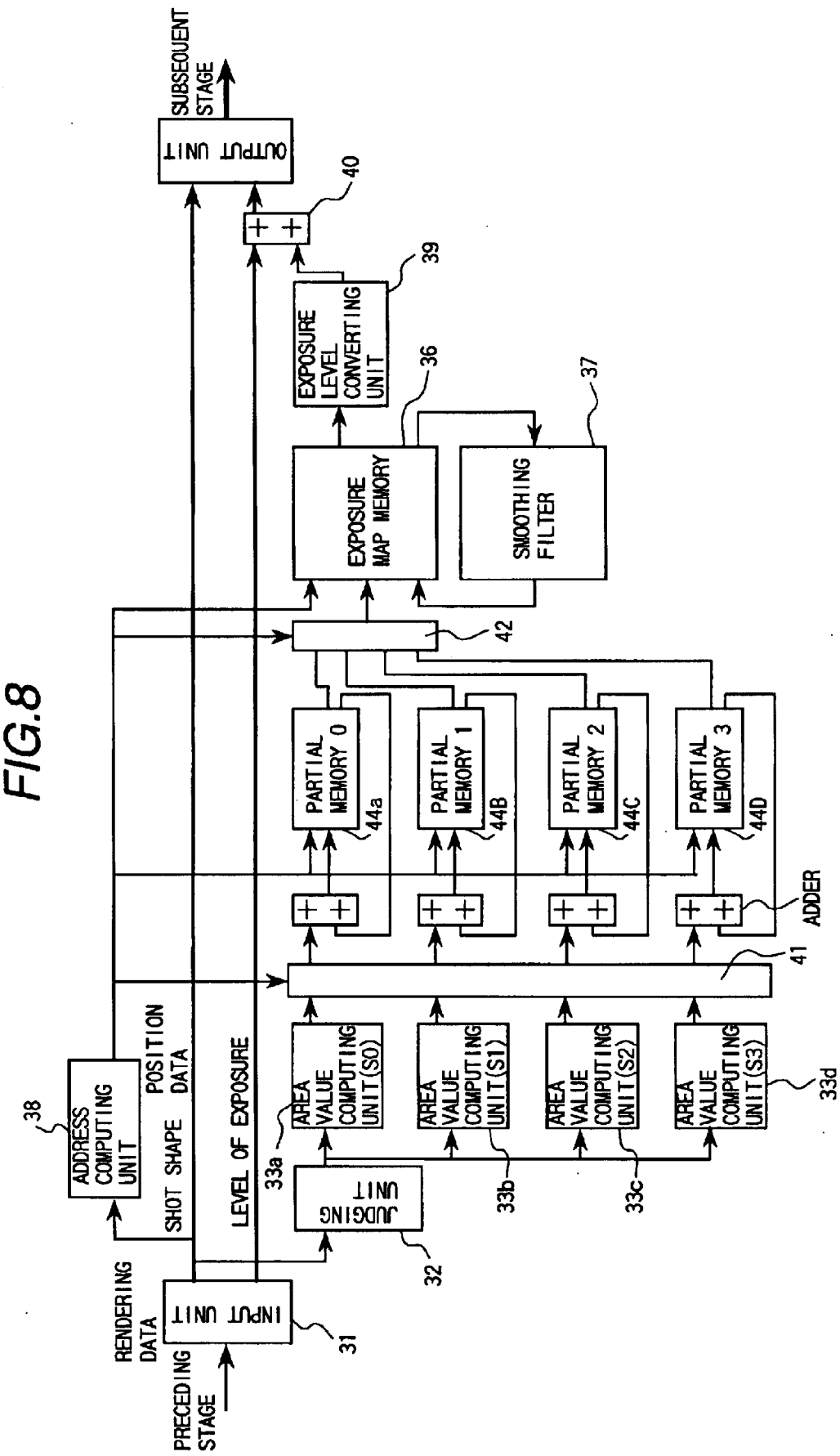
FIG. 8 is a block diagram of another proximity effect correcting unit of the invention.

FIG. 8 is a block diagram of another proximity effect correcting unit of the invention. In FIG. 8, the components with their functionally identical or equivalent counterparts included in FIG. 3 are designated by like reference numerals. In this proximity effect correcting unit, partial memories 44a through 44d are laid out in the same manner as in the circuit of FIG. 3 while a selector 41 is located downstream of area value computing units 33a through 33d which calculate area values for each mesh. The selector 41 judges through address calculations which of the four meshes (bottom left, bottom right, top left, top right) enclosed by thick lines in FIG. 9 corresponds to the position of the mesh whose area value has been computed. In so doing, the selector 41 selects one of partial memories 0 through 3 in which to store the calculated area value.

The address of the selected partial memory is sent from an address computing unit 38. The area value is then written to four partial memories 44a through 44d in accordance with the assignments shown in Tables 2 through 5. At the same time, the data at the same address in the partial memories 44a through 44d are retrieved therefrom and added to the data existing at the same address before the write operation.

In practice, to retrieve the existing data requires selecting the partial memories 44a through 44d. The requirement is met by a selector 42 located downstream of the partial memories 44a through 44d. Alternatively, the selector 42 is not needed if a downstream exposure map 36 is constituted by four memories. In such a case, the partial memory numbers (i.e., partial memories 0 through 3) need only be assigned to the four exposure map memories.

More specifically, the selector 42 may be omitted where the partial memory 0 is allocated to the exposure map memory 0, the partial memory 1 to the exposure map memory 1, partial memory 2 to the exposure map memory 2, and the partial memory 3 to the exposure map memory 3. This arrangement affords an appreciable memory saving. With the area of the memory layout thus reduced, the area for mounting component parts is diminished correspondingly.

Although the examples above have been shown utilizing partial memories, this is not limitative of the invention. Alternatively, area values or area density data may be written directly to the exposure map, i.e., without memory intervention.

As described and according to the invention, highly precise exposure maps are created regardless of the shot size. With no need to minimize the shot size, the time required to create exposure maps is shortened substantially.

As many apparently different embodiments of this invention may be made without departing from the spirit and scope thereof, it is to be understood that the invention is not limited to the specific embodiments thereof except as defined in the appended claims.

What is claimed is:

1. An electron beam lithography system comprising:
    an exposure map creating unit which, based on positional relations between meshes dividing a region to be rendered by an electron beam on the one hand and shots to be rendered by said electron beam on the other hand, creates an exposure map by calculating an area density from a shot area included in each of said meshes; and
    a proximity effect correcting unit that corrects a level of exposure for each of said shots by referencing said exposure map so that each shot is exposed at the corrected level;
    wherein said proximity effect correcting unit includes:
        a judging unit that judges whether or not each shot straddles a plurality of meshes based on positional relations between coordinates of two diagonally positioned edge points of each shot on the one hand and mesh boundaries on the other hand;

a plurality of area value computing units that compute an area of a respective shot in each of the meshes;

a plurality of adding circuits; and a plurality of memories that store said computed area values of shots included in each respective mesh, wherein said adding circuits add newly computed area values in respective memories to previously computed area values for each respective mesh.

2. An electron beam lithography system according to claim 1, wherein, based on positional relations between coordinates of two diagonally positioned corner points of each shot on the one hand and mesh boundaries on the other hand, said judging unit judges whether the shot in question straddles said plurality of meshes.

3. An electron beam lithography system according to claim 1, wherein said exposure map creating unit divides each shot straddling said plurality of meshes by boundaries of said meshes so that either area values or area densities of divided shots included in each mesh are added to the mesh in question.

4. An electron beam lithography system according to claim 3, further comprising N×M memories for accommodating either area values or area densities of shots, N representing a maximum number of divided shots in a direction of one boundary of a given mesh, M denoting a maximum number of divided shots in a direction of another boundary of the mesh in question.

5. An electron beam lithography system according to claim 4, wherein, when either an area value or an area density of each shot is divided for a plurality of meshes in order to store the divided values or densities into said memories, either the divided shot area values or the divided shot area densities included in each mesh are set simultaneously to different addresses in different memories so that when data are to be retrieved from said memories, said data are read from the same address of all memories.

6. An electron beam lithography system according to claim 5, further comprising a function for adding up a plurality of data retrieved from the same address in a plurality of said memories.

7. An electron beam lithography system according to claim 4, further comprising N×M memories assigned the same addresses as those of N×M meshes constituting each of mesh groups dividing said region to be rendered by said electron beam.

8. An electron beam lithography system according to claim 7, further comprising a selecting unit a desired memory as well as a desired address therein from among said N×M memories in accordance with the address of a given mesh.

9. An electron beam lithography system according to claim 8, wherein said selecting unit selects the memory into which to store either the area value or the area density of the mesh in question at an address (m, n) on the basis of a remainder from a formula of n/N and a remainder from a formula of m/M, said selecting unit further selecting said address based on a quotient of said formula of n/N and on a quotient of said formula of m/M.

10. An electron beam lithography system comprising:

an exposure map creating unit which, based on positional relations between meshes dividing a region to be rendered by an electron beam on the one hand and shots to be rendered by said electron beam on the other hand, creates an exposure map by calculating an area density from a shot area included in each of said meshes; and a proximity effect correcting unit that corrects a level of exposure for each of said shots by referencing said exposure map so that each shot is exposed at the corrected level;

wherein said proximity effect correcting unit includes:

a judging unit that judges whether or not each shot straddles a plurality of meshes; and a plurality of area value computing units that compute an area value or area density of a respective shot in each of the meshes;

a plurality of adding circuits; and wherein said exposure map is made of N×M memories for accommodating either area values or area densities of respective shots, N representing a maximum number of divided shots in a direction of one boundary of a given mesh, M denoting a maximum number of divided shots in a direction of another boundary of the mesh in question, wherein said adding circuits add newly computed area values or area densities in respective memories to previously computed area values or area densities for each respective mesh.

* * * * *

UNITED STATES PATENT AND TRADEMARK OFFICE
CERTIFICATE OF CORRECTION

PATENT NO. : 6,828,573 B1
DATED : December 7, 2004
INVENTOR(S) : Hajime Kawano et al.

It is certified that error appears in the above-identified patent and that said Letters Patent is hereby corrected as shown below:

Column 12,
Line 19, change "$N_a/2$." to -- $N_s/2$. --.

Signed and Sealed this

Twenty-eighth Day of June, 2005

JON W. DUDAS
*Director of the United States Patent and Trademark Office*